US007928347B2

(12) United States Patent
Sako

(10) Patent No.: US 7,928,347 B2
(45) Date of Patent: Apr. 19, 2011

(54) HEATING UNIT AND METHOD OF MAKING THE SAME

(75) Inventor: Teruhisa Sako, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 394 days.

(21) Appl. No.: 11/728,412

(22) Filed: Mar. 26, 2007

(65) Prior Publication Data

US 2007/0241430 A1 Oct. 18, 2007

(30) Foreign Application Priority Data

Apr. 12, 2006 (JP) ................................ 2006-109403

(51) Int. Cl.

| | |
|---|---|
| ***H05B 3/26*** | (2006.01) |
| ***H05B 3/28*** | (2006.01) |
| ***G03G 15/20*** | (2006.01) |
| ***H01L 23/29*** | (2006.01) |
| ***H01L 23/31*** | (2006.01) |

(52) U.S. Cl. ........ 219/548; 219/216; 219/544; 399/329; 399/333; 257/496

(58) Field of Classification Search ........................ None
See application file for complete search history.

(56) References Cited

U.S. PATENT DOCUMENTS

| | | | | |
|---|---|---|---|---|
| 3,754,881 | A * | 8/1973 | Petticrew | 65/33.7 |
| 3,974,360 | A * | 8/1976 | Panzarino | 219/543 |
| 5,020,214 | A * | 6/1991 | Tsuruoka et al. | 29/611 |
| 5,252,809 | A * | 10/1993 | Demin | 219/543 |
| 6,118,109 | A * | 9/2000 | Sako | 219/216 |
| 6,791,069 | B2 * | 9/2004 | Sako et al. | 219/543 |
| 2004/0060925 | A1 * | 4/2004 | Zhou et al. | 219/543 |
| 2009/0102910 | A1 * | 4/2009 | Sako | 347/203 |
| 2009/0321406 | A1 * | 12/2009 | Aritaki et al. | 219/201 |

FOREIGN PATENT DOCUMENTS

| | | | |
|---|---|---|---|
| JP | 61227206 | A * | 10/1986 |
| JP | 63074658 | A * | 4/1988 |
| JP | 06246944 | A * | 9/1994 |
| JP | 09283890 | A * | 10/1997 |
| JP | 2000340719 | A * | 12/2000 |
| JP | 2002-75599 | | 3/2002 |
| JP | 2003197351 | A * | 7/2003 |

* cited by examiner

*Primary Examiner* — Joseph M Pelham

(74) *Attorney, Agent, or Firm* — Hamre, Schumann, Mueller & Larson, P.C.

(57) ABSTRACT

A heating unit includes an AlN substrate having a main surface on which an elongated heat-generating resistor is provided. A protection layer is formed on the main surface of the substrate for the heat-generating resistor. The protection layer includes a first cover layer covering the heat-generating resistor and a second cover layer covering the first cover layer. The first cover layer is made of crystallized or semi-crystallized glass having a higher crystallization temperature by at least 50° C. than the softening point of the glass. The second cover layer is made of non-crystalline glass.

5 Claims, 3 Drawing Sheets

HEATING UNIT AND METHOD OF MAKING THE SAME

BACKGROUND OF THE INVENTION

1. Field of the Invention

The present invention relates to a heating unit used in e.g. a printer for heating printing paper to thermally fix toner on the printing paper. In particular, it relates to a heating unit whose substrate is made of a ceramic material such as aluminum nitride (AlN). The present invention also relates to a method of making such a heating unit.

2. Description of the Related Art

For thermally fixing toner on the surface of a printing paper in a printing process, generally, a toner image formed on the surface of a photosensitive drum is transferred onto the printing paper, and then the printing paper is heated by a heating unit to fix the toner on the printing paper with the heat provided by the heating unit. Such fixing process is normally executed while conveying the printing paper under pressure through between the heating unit located on the side of the back surface of the printing paper and a pressure roller located on the side of the main surface of the printing paper. To efficiently fix the toner while quickly conveying the printing paper, it is effective to expand the area that can be heated by the heating unit, in other words the heating width along the conveying direction of the printing paper, as much as possible.

FIG. 7 depicts a heating unit designed from such viewpoint (for example, disclosed in JP-A-2002-75599). The heating unit X is a strip-shaped plate elongated in a direction perpendicular to the paper conveying direction. The heating unit X serves to heat the printing paper P, on which the toner T has been transferred, held under pressure provided by the pressure roller R, to fix the toner T on the printing paper P.

The heating unit X shown in FIG. 7 includes a ceramic substrate 101 made mainly of aluminum nitride (AlN), oxide layers 102 covering the main surface 101*a* and the back surface 101*b* of the AlN substrate, a heat-generating resistor 103 constituted of silver and palladium and formed on the back surface 101*b*, and a cover layer 104 printed in a form of a thick film to cover the heat-generating resistor 103. In FIG. 7, the AlN substrate 101 is oriented such that the main surface 101*a* is located on the upper side in the drawing, and the back surface 101*b* on the lower side. The cover-layer 104 includes a first cover layer 141 formed to cover the heat-generating resistor 103, and a second cover layer 142 formed to cover the first cover layer 141. The oxide layer 102 is formed as a result of oxidation of the main surface 101*a* and the back surface 101*b* of the AlN substrate 101, through the sintering process of the heat-generating resistor 103. The first cover layer 141 is formed of crystallized glass, and the second cover layer 142 is formed of non-crystalline glass. Also, although not shown, the back surface 101*b* of the AlN substrate 101 includes an electrode layer for supplying power to the heat-generating resistor 103.

In the heating unit X, when power is supplied to the heat-generating resistor 103 via the electrode layer which not shown, the heat-generating resistor 103 generates heat at a predetermined calorific value. The AlN substrate employed in the heating unit X is highly heat-conductive, and hence the heat is efficiently transmitted throughout the entire substrate. Accordingly, locating the heat-generating resistor 103 on the back surface 101*b* of the AlN substrate 101 and providing the printing paper P on the main surface 101*a* as shown in FIG. 7 allows the overall main surface 101*a* of the AlN substrate 101 to act as a heating surface, thereby efficiently heating the printing paper P. Also, since the heat spreads all over the AlN substrate 101, the AlN substrate 101 can be kept from cracking or being otherwise damaged because of an internal temperature difference.

When manufacturing the heating unit X thus configured, glass paste is print-sintered after sintering the heat-generating resistor 103, to thereby sequentially form the first cover layer 141 and the second cover layer 142. Upon print-sintering the glass paste on the AlN substrate 101, oxygen in the glass component and nitrogen in the AlN substrate 101 are reacted, thereby foaming. Accordingly, in the heating unit X, the crystallized glass, which generally has a porous structure is utilized as the first cover layer 141, to discharge the foam quickly.

Recently, however, the printing apparatus has also come to be required to incorporate a measure against a lightning surge, and the components incorporated in the printing apparatus such as the heating unit X are required to have a still higher withstand voltage. Although not shown, the second cover layer 142 of the heating unit X is also provided with a thermistor that controls the heating unit X to facilitate the printing paper P to pass on the main surface 101*a* of the AlN substrate 101, as well as a thermoswitch and a thermal fuse for disconnecting the power when the control is disabled for some reason. The thermistor, thermoswitch and thermal fuse generally include metallic parts. Such metallic parts may serve as the ground, such that when a transitional surge emerges in the heat-generating resistor 103 from switching or lightning, the first cover layer 141 and the second cover layer 142 suffer a dielectric breakdown. Since the heating unit X employs the crystallized glass which often has a porous structure as the first cover layer 141, sufficient insulation performance cannot be expected, and therefore the surge issue is particularly critical.

SUMMARY OF THE INVENTION

The present invention has been proposed in view of the foregoing situation, with an object to provide a heating unit that can achieve a higher withstand voltage, and a method of manufacturing method such heating unit.

A first aspect of the present invention provides a heating unit comprising an AlN substrate; a heat-generating resistor provided in a strip shape on the AlN substrate; and a protection layer for the heat-generating resistor. The protection layer includes a first cover layer that covers the heat-generating resistor and a second cover layer that covers the first cover layer. The first cover layer is formed of crystallized glass or semi-crystallized glass having a higher crystallization temperature than the glass softening point by 50° C. or more, while the second cover layer is formed of non-crystalline glass.

In the heating unit thus constructed, the crystallized glass or semi-crystallized glass forms a closely packed rather than a porous one, thereby upgrading the withstand voltage of the first cover layer. In general, the crystallized glass or the semi-crystallized glass is formed by heating the glass that is the material of the crystallized glass or semi-crystallized glass. Since the glass softening point of the material glass is lower than the crystallization temperature of the crystallized glass or semi-crystallized glass by 50° C. or more, glass component in the crystallized glass or semi-crystallized glass can flow during the period after the material glass starts to soften until it is crystallized. Accordingly, the first cover layer becomes a non-porous, closely packed layer of the crystallized glass or semi-crystallized glass. Also, the second cover layer has a closely packed structure because of being formed of the non-crystalline glass, and is hence advantageous in improving the withstand voltage.

In a preferred embodiment, the heating unit further includes a third cover layer that covers at least part of a region where the first cover layer is not provided, on the surface of the AlN substrate where the first cover layer is provided. The third cover layer is formed of non-crystalline glass higher in glass softening point than the non-crystalline glass constituting the second cover layer, and the second cover layer is provided on the foundation of the first cover layer and at least a part of the third cover layer.

In the heating unit thus constructed, the third cover layer, which is located in direct contact with the AlN substrate, takes a shorter time in hardening after sintering than the second cover layer. Accordingly, the reaction between the glass component and the AlN substrate can be better suppressed, resulting in minimized void defects from foaming.

A second aspect of the present invention provides a method of manufacturing a heating unit comprising a step of sintering a heat-generating resistor in a strip shape on an AlN substrate; a step of sintering a first cover layer to cover the heat-generating resistor; a step of sintering a second cover layer to cover the first cover layer. The step of sintering the first cover layer includes employing crystallized glass or semi-crystallized glass having a higher crystallization temperature than the glass softening point by 50° C. or more. The sintering of the first cover layer is performed at a temperature higher than the glass softening point of the crystallized glass or semi-crystallized glass by 50 to 70° C. The sintering of the second cover layer includes employing non-crystalline glass and executing the sintering at a sintering temperature higher than the glass softening point of the non-crystalline glass, but with a difference of 100° C. or less.

In a preferred embodiment, the crystallized glass or semi-crystallized glass constituting the first cover layer has a glass softening point of 740° C. or higher, and the sintering temperature of the first cover layer is 800 to 850° C.

By the manufacturing method thus arranged, in the step of sintering the first cover layer, since the sintering temperature is limited in the range higher than the glass softening point by 50 to 70° C., the crystallized glass or semi-crystallized glass is formed into a closely packed layer. Also, setting the sintering temperature of the second cover layer in a range higher than the softening point of the non-crystalline glass by 100° C. or less is advantageous in suppressing the reaction between the AlN substrate and the non-crystalline glass that leads to foaming.

In another preferred embodiment, the method further includes a step of sintering a third cover layer on the AlN substrate before sintering the second cover layer, and the step of sintering the second cover layer includes forming the second cover layer on the foundation of the first cover layer and at least a part of the third cover layer. The step of sintering the third cover layer employs the non-crystalline glass higher in glass softening point than the non-crystalline glass constituting the second cover layer, and it is preferable to execute the sintering at a sintering temperature higher than the glass softening point of the non-crystalline glass, but with a difference of 30° C. or less.

The method thus arranged suppresses the reaction of the third cover layer with the AlN substrate and the resultant foaming, because the third cover layer is sintered at a temperature close to the glass softening point. Also, the second cover layer is formed after the third cover layer is formed on the AlN substrate, and therefore the non-crystalline glass and the AlN substrate are no longer reacted, when the second cover layer is formed.

Other features and advantages of the present invention will become more apparent from the detailed description given below referring to the drawings.

DETAILED DESCRIPTION OF THE PREFERRED EMBODIMENTS

Figure 1:
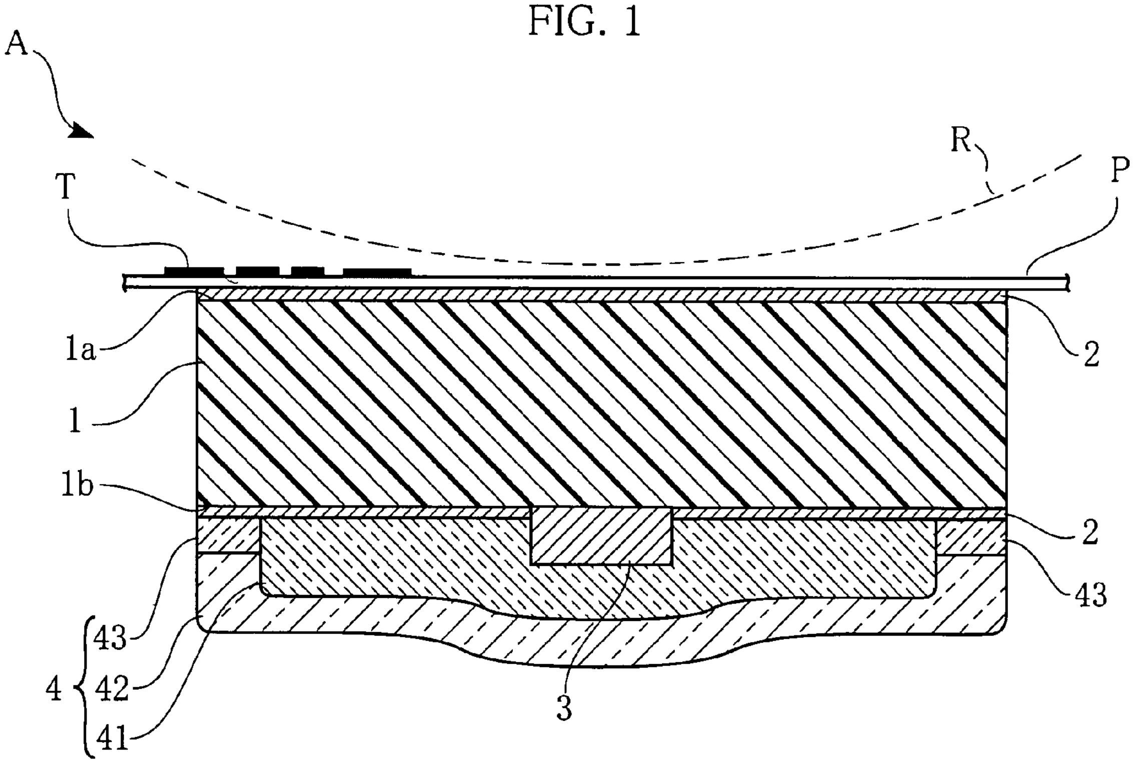
FIG. 1 is a cross-sectional view of a heating unit according to a first embodiment of the present invention.

FIG. 1 is a cross-sectional view of a heating unit according to a first embodiment of the present invention. The illustrated heating unit A includes an AlN substrate 1, oxide layers 2, a heat-generating resistor 3, and a protection layer 4. The AlN substrate 1 has an upper or main surface 1*a*, and a lower or back surface 1*b*. The heating unit A is used in e.g. a printer to provide heat for fixing toner T on printing paper P. The printing paper P with the toner T transferred thereto is conveyed along the surface of the heating unit A under appropriate pressure provided by the pressure roller R, and the heat of the heating unit A fixes the toner T on the printing paper P.

The AlN substrate 1, made of aluminum nitride, is elongated in a direction perpendicular to the print paper conveying direction. The AlN substrate 1 is 7 to 14 mm in width and 0.5 to 0.7 mm in thickness. The aluminum nitride has excellent thermal response, and therefore the heat tends to spread substantially uniformly through the AlN substrate 1, which is advantageous in preventing the substrate from cracking. Also, the excellent thermal response permits locating the heat-generating resistor 3 on the back surface 1*b* of the AlN substrate 1 and utilizing the main surface 1*a* as the heating surface, as shown in FIG. 1. Although not shown in FIG. 1, the AlN substrate 1 includes an electrode layer for supplying power to the heat-generating resistor 3.

The heat-generating resistor 3 is for example a silver/palladium resistor containing 15 wt % or more of palladium, and is disposed on the back surface 1*b* of the AlN substrate 1, to extend along the lengthwise side of the AlN substrate 1. When power is supplied by a driving unit (not shown) to the heat-generating resistor 3 via the electrode layer which is not shown, the heat-generating resistor 3 generates heat at a predetermined calorific value. The heat-generating resistor 3 is formed by sintering a resistor paste to have a thick-film shape with a predetermined width. The foregoing weight ratio of the heat-generating resistor 3 is selected for efficiently discharge the gas generated from the reaction between the glass component of the resistor paste and the component of the AlN substrate 1, which takes place during the sintering process of the heat-generating resistor 3. Also, the thickness of the heat-generating resistor 3 may be appropriately determined according to the required calorific value, normally in a range of 7 to 23 μm, for example.

The oxide layer 2 is an aluminum oxide layer formed as a result of oxidation of the main surface 1*a* and the back surface 1*b* of the AlN substrate 1 during the sintering process of the heat-generating resistor 3. Also, the AlN substrate 1 may be intentionally heated before forming the heat-generating resistor 3, to form the oxide layer 2 in advance. The oxide layer 2 serves to prevent the reaction of nitrogen in the AlN substrate 1 and the glass component in the glass paste.

The protection layer 4 is formed of glass, and serves to protect the electrode layer (not shown) provided on the back surface 1*b* of the AlN substrate 1, and the heat-generating resistor 3. The protection layer 4 includes a first cover layer 41 that covers the heat-generating resistor 3, a second cover layer 42 that covers the first cover layer 41, and a third cover layer 43 formed on a region where the first cover layer 41 is not provided on the back surface 1*b* of the AlN substrate 1.

The first cover layer 41 is formed in a thick film of for example 20 to 40 μm in thickness, from glass paste predominantly composed of a material of crystallized glass of semi-crystallized glass, and is located to cover the heat-generating resistor 3 on the foundation of the heat-generating resistor 3 and a part of the back surface 1*b* of the AlN substrate 1. The crystallized glass or semi-crystallized glass predominantly composing the first cover layer 41 has a glass softening point of 740° C., and a crystallization temperature of 790 to 810° C. The crystallized glass or semi-crystallized glass generally has excellent heat resistance, and hence the first cover layer 41 is not fused even by direct application of the heat generated by the heat-generating resistor 3. Also, the difficulty for the heat from the heat-generating resistor 3 to be transmitted to the first cover layer 41 causes a majority of the calories is transmitted to the AlN substrate 1, thereby urging the heat increase on the surface of the AlN substrate 1.

The third cover layer 43 is provided in a region where the first cover layer 41 is not provided, on the back surface 1*b* of the AlN substrate 1, to surround the first cover layer 41. The third cover layer 43 is formed into a closely packed layer of approx. 10 to 25 μm in thickness, from glass paste predominantly composed of non-crystalline glass. The non-crystalline glass predominantly constituting the third cover layer 43 has a glass softening point of 780 to 810° C.

The second cover layer 42 is formed from glass paste predominantly composed of non-crystalline glass into a thick film with a smooth surface and, for example, 30 to 50 μm in thickness, to cover the first cover layer 41 and the third cover layer 43. Because of the smooth surface, the second cover layer 42 is less likely to be damaged by a foreign material such as dust, and besides prevents a foreign material such as moisture from intruding, because of being a closely packed structure of the non-crystalline glass. Also, to an outer face of the second cover layer 42, metallic parts such as a thermistor that controls the heating unit A, a thermoswitch and a thermal fuse for disconnecting the power when the control is disabled for some reason, are attached.

A manufacturing method of the foregoing heating unit A will now be described below.

FIGS. 2 to 5 are cross-sectional views showing processes in an embodiment of the manufacturing method of the heating unit A. The following description will be made referring to these drawings. Here, FIGS. 2 to 5 illustrate the AlN substrate 1 in the reverse orientation to FIG. 1. Accordingly, the upper side surface of the AlN substrate 1 in FIGS. 2 to 5 will be referred to as the back surface 1*b*, and the lower side surface as the main surface 1*a*.

Figure 2:
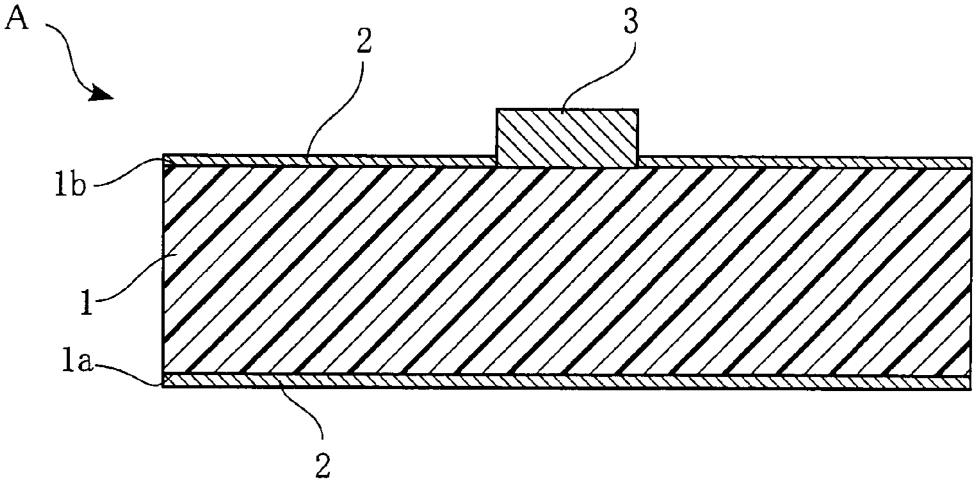
FIG. 2 is a cross-sectional view showing a formation process of a heat-generating resistor by a manufacturing method of the heating unit of FIG. 1.

Firstly, as shown in FIG. 2, the heat-generating resistor 3 is formed on a predetermined position on the back surface 1*b* of the AlN substrate 1. More specifically, a resistor paste including a resistor component constituted of silver/palladium, with 15 wt % or more of palladium in the resistor component, is applied to the predetermined position on the back surface 1*b* of the AlN substrate 1, in a form of a thick film by a printing method. The resistor paste is the dried, and sintered under a temperature of 700 to 850° C. Because of the above specified weight ratio of the palladium, the film formation of the silver by sintering is suppressed during the sintering process. Accordingly, the gas generated from the reaction of the glass component of the resistor paste and the component of the AlN substrate 1 can be efficiently discharged, and hence formation of void defect in the heat-generating resistor 3 because of foaming during the sintering can be prevented. Also, during the sintering of the resistor paste, the oxide layer 2 is also formed at a time in a region on the AlN substrate 1 where the heat-generating resistor 3 is not formed, in a thickness of approx. 1.0 to 10 μm. The oxide layer 2 serves to suppress the subsequent reaction between the AlN substrate 1 and the glass component. Here, it is preferable to form an interconnect pattern on the back surface 1*b* of the AlN substrate 1, for supplying power to the heat-generating resistor 3, in advance of this process.

Figure 3:
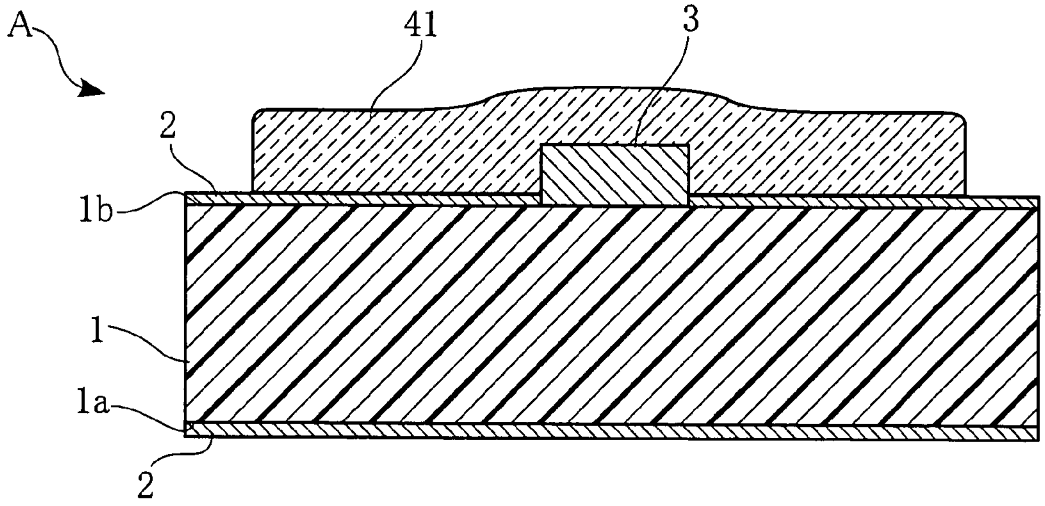
FIG. 3 is a cross-sectional view showing a formation process of a first cover layer by the manufacturing method of the heating unit of FIG. 1.

Then as shown in FIG. 3, the first cover layer 41 is formed to cover the heat-generating resistor 3. At first, glass paste predominantly composed of crystallized glass or semi-crystallized glass material having a glass softening point of 740° C. and a crystallization temperature of 790 to 810° C. is heated up to 740° C. for softening, and printed in a form of a thick film to cover the heat-generating resistor 3. At this stage, the glass paste is to be applied to expose the left and right end portions (according to the orientation of FIG. 3) of the back surface 1*b* of the AlN substrate 1 as shown in FIG. 3. The glass paste thus applied is dried and then sintered at a temperature of 800 to 850° C., preferably at 810° C., to thereby crystallize the crystallized glass or semi-crystallized glass. The first cover layer 41 can be thus formed.

Figure 4:
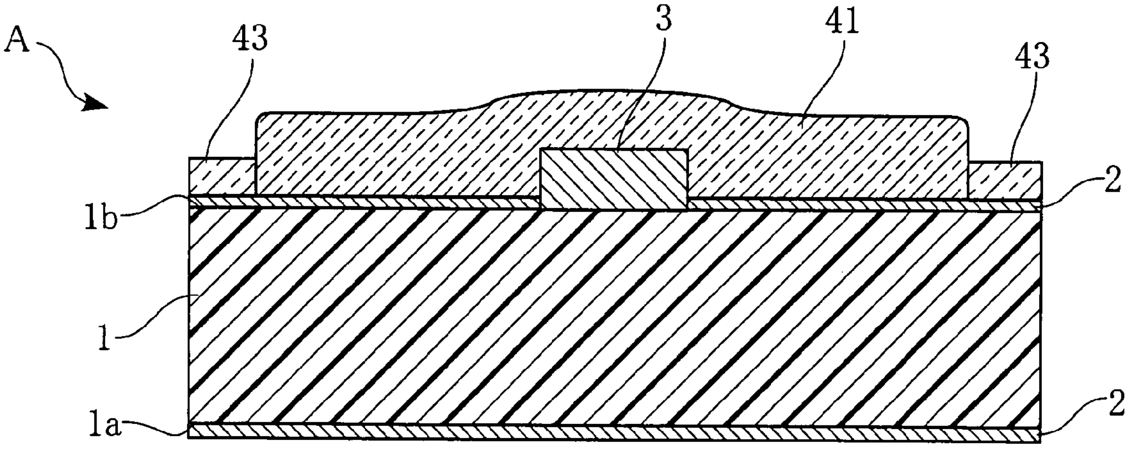
FIG. 4 is a cross-sectional view showing a formation process of a third cover layer by the manufacturing method of the heating unit of FIG. 1.

The above is followed by formation of the third cover layer 43 as shown in FIG. 4, in a region on the back surface 1*b* of the AlN substrate 1 not occupied by the heat-generating resistor 3 or the first cover layer 41. Firstly, glass paste predominantly composed of non-crystalline glass having a glass softening point of 780 to 810° C. is printed in a form of a thick film of approx. 10 to 25 μm in thickness, in a region on the back surface 1*b* of the AlN substrate 1 unoccupied by the first cover layer 41, to surround the first cover layer 41. Then the glass paste is dried, followed by sintering at 810° C., and cooling for hardening. Here, the sintering temperature may be altered as long as the temperature is higher than the glass softening point, and the difference is 30° C. or less.

Figure 5:
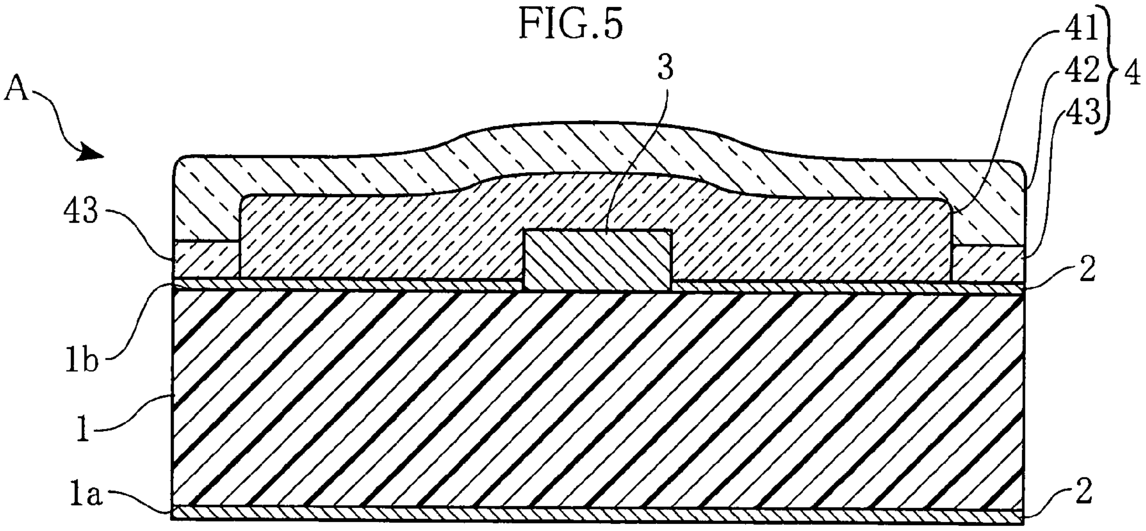
FIG. 5 is a cross-sectional view showing a formation process of a second cover layer by the manufacturing method of the heating unit of FIG. 1.

Proceeding to FIG. 5, the second cover layer 42 is formed to cover the first cover layer 41 and the third cover layer 43. Firstly, glass paste predominantly composed of non-crystalline glass having a glass softening point of 700° C. or higher is printed in a form of a thick film, on the foundation of the first cover layer 41 and the third cover layer 43. The printed glass paste is then dried, and sintered at 800 to 850° C., followed by cooling for hardening. Preferably, the glass softening point of the non-crystalline glass employed as the second cover layer 42 is lower than the sintering temperature in this process, with a difference of 100° C. or less. It is preferable to attach, after this process, the metallic parts which are not shown, such as a thermistor that controls the heating unit A, a thermoswitch and a thermal fuse for disconnecting the power when the control is disabled for some reason, to the outer face of the second cover layer 42.

Through the foregoing process, the heating unit A can be efficiently manufactured. In addition to the above process, the manufacturing method may also include a process of coating the main surface 1*a* of the AlN substrate 1 with a smooth and heat-conductive resin, and a process of forming the oxide layer 2 in advance on the main surface 1*a* and the back surface 1*b* of the AlN substrate 1.

The heating unit A thus configured provides the following advantageous effects.

The first cover layer 41 is formed by sintering the glass paste including the material of crystallized glass or semi-crystallized glass at a sintering temperature higher than the glass softening point of the glass paste, but with a difference in a range of 50 to 70° C. This sintering temperature range includes the crystallization temperature of the crystallized glass or semi-crystallized glass predominantly constituting the first cover layer 41, and hence the first cover layer 41 is crystallized and hardened, during this sintering process. Since the crystallization temperature of the first cover layer 41 is higher than the glass softening point of the glass paste by 50° C. or more, the glass component in the paste flows, while the first cover layer 41 turns from the paste to the crystallized state. Accordingly, the first cover layer 41 is formed into a closely packed layer rather than a porous layer, and thus exhibits excellent electrical insulation performance. Besides, the second cover layer 42 and the third cover layer 43 are originally closely packed layers formed of the non-crystalline glass, and are hence excellent in electrical insulation. The heating unit A includes, therefore, the protection layer 4 which is excellent in electrical insulation between the metallic parts and the heat-generating resistor 3, thereby achieving a higher withstand voltage, thus minimizing the likelihood of being damaged by a surge originating from lightning or other reasons.

Also, since the sintering temperature of the first cover layer 41 is not more than 70° C. higher than the glass softening point of the glass paste, the glass component is kept form being excessively liquefied, and hence the reaction between the glass component and the component of the AlN substrate 1 can be suppressed. Accordingly, the first cover layer 41 suppresses the emergence of the void defect originating from the foaming. Further, the crystallized glass or semi-crystallized glass is generally excellent in heat resistance, and is not fused again once crystallized, and therefore the first cover layer 41 is not fused again during the sintering process of the second cover layer 42 and the third cover layer 43.

The third cover layer 43 is formed by sintering the non-crystalline glass, the predominant component thereof, at a sintering temperature higher than the glass softening point of the non-crystalline glass but with a difference of 30° C. or less. In the case where the glass softening point and the sintering temperature are thus close, it takes shorter before the glass component is hardened after the sintering, and hence the glass component can only remain liquefied for a shorter time. Such arrangement allows suppressing the reaction between the glass component and the component of the AlN substrate 1, thereby preventing emergence of the void defect originating from the foaming. Also, the third cover layer 43 is formed in a thickness of approx. 10 to 25 μm, which allows shortening the time required for sintering and cooling. Further, since the third cover layer 43 is disposed adjacent to the first cover layer 41 to surround the same, the entirety of the back surface 1*b* of the AlN substrate 1 is covered with either the first cover layer 41 or the third cover layer 43. In other words, the back surface 1*b* of the AlN substrate 1 is covered with the first cover layer 41 and the third cover layer 43, both of which can suppress emergence of the void defect originating from the foaming. The second cover layer 42 is sintered on the foundation constituted of the first cover layer 41 and the third cover layer 43, and therefore the sintering process of the second cover layer 42 can be executed free from the reaction between the glass component and the component of the AlN substrate 1.

The second cover layer 42 is formed by sintering the glass paste predominantly composed of the non-crystalline glass having a glass softening point of 700° C. or higher, at a sintering temperature of 800 to 850° C. Limiting the difference between the glass softening point and the sintering temperature in a range of 100° C. or less allows suppressing, to a certain extent, the reaction between the glass component and the AlN substrate 1, in case where the first cover layer 41 or the third cover layer 43 should be chipped. Also, the third cover layer 43 may be softened during the sintering of the second cover layer 42. However, since the glass softening point of the non-crystalline glass predominantly constituting the third cover layer 43 is 780° C. or higher and the sintering temperature of the second cover layer 42 is 800 to 850° C., the third cover layer 43 remains softened for a short time only, and the foaming is suppressed to a minimal extent. Thus, the protection layer 4 of the heating unit A is least likely to incur the void defect originating from the foaming, and also excellent in strength. Besides, the outermost surface of the protection layer 4 is formed of the smooth non-crystalline glass, and hence there is little likelihood that an external foreign material gets caught by the protection layer 4, thereby peeling off and damaging the protection layer 4.

Figure 6:
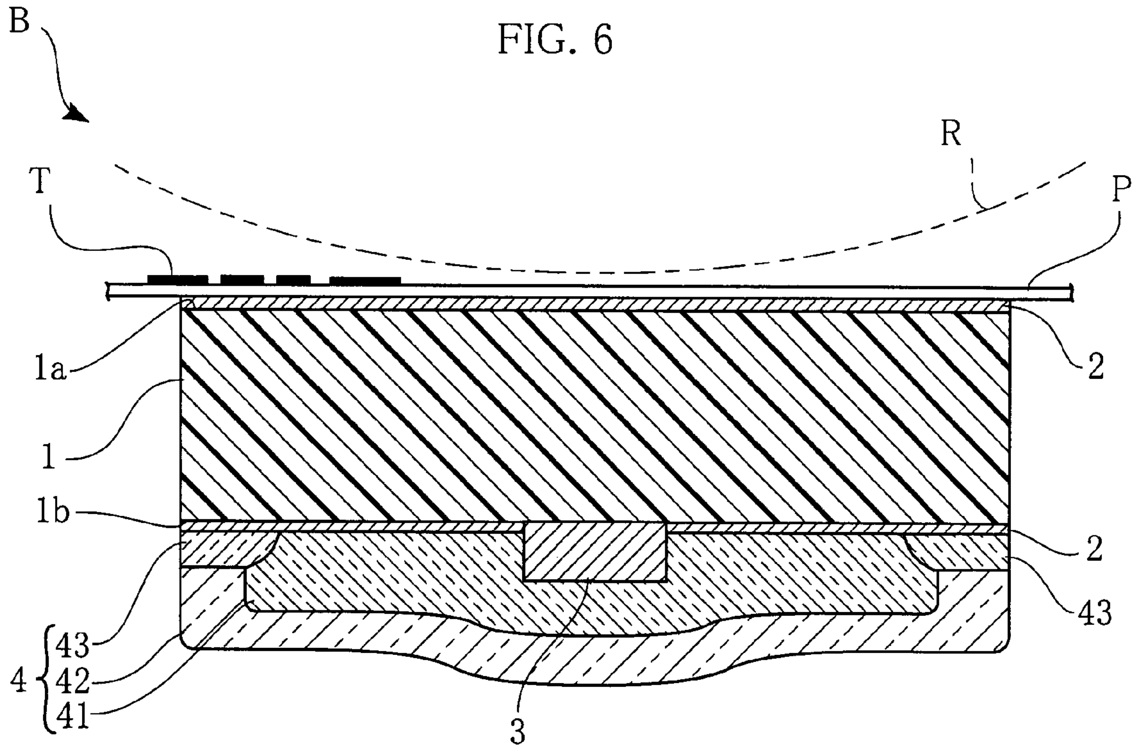
FIG. 6 is a cross-sectional view of a heating unit according to a second embodiment of the present invention.
Figure 7:
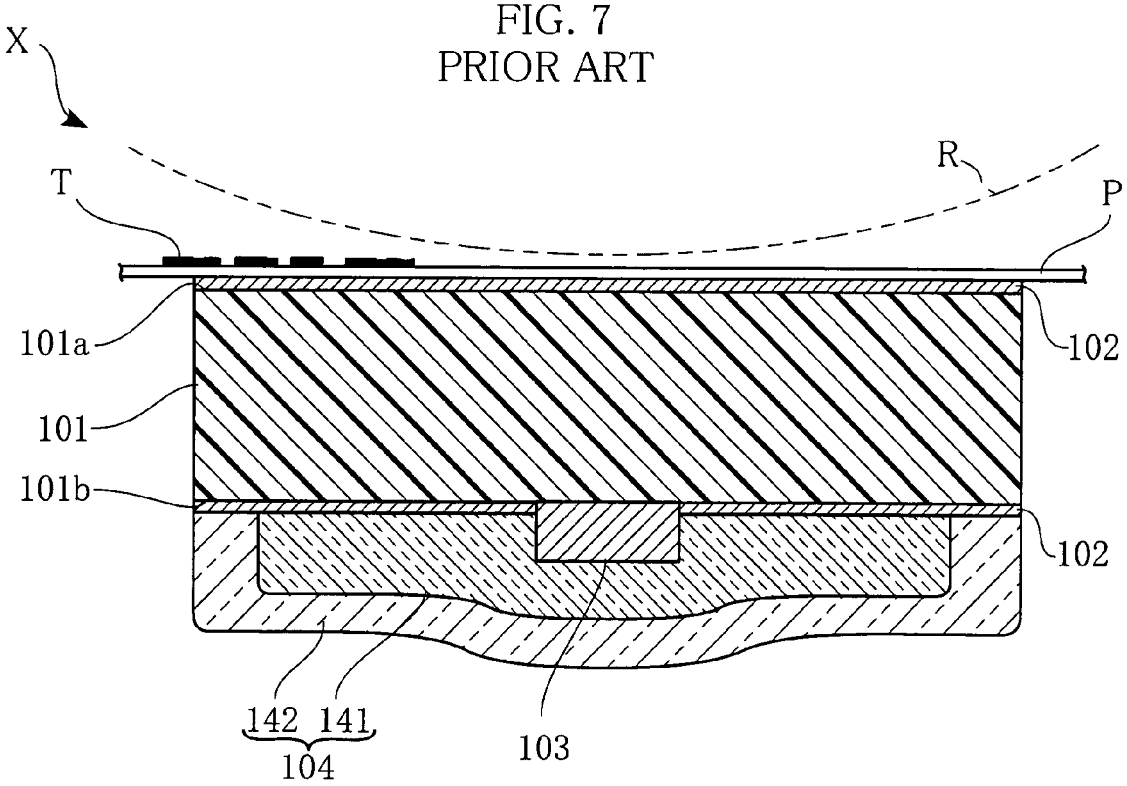
FIG. 7 PRIOR ART
FIG. 7 is a cross-sectional view of a conventional heating unit.

FIG. 6 illustrates another embodiment of the heating unit. In the heating unit B shown in FIG. 6, a part of the third cover layer 43 of the heating unit A according to the foregoing embodiment intrudes in the first cover layer 41. In the heating unit B thus configured, the contact interface between the third cover layer 43 and the first cover layer 41 is inclined, which is advantageous in isolating the second cover layer 42 from the back surface 1*b* of the AlN substrate 1. In the manufacturing method of the heating unit B, it is preferable to form the third cover layer 43 before forming the first cover layer 41. In the remaining portions, the heating unit B has the same structure as the heating unit A.

As still another embodiment, the third cover layer 43 of the heating unit A may be omitted, so that the protection layer 4 only includes the first cover layer 41 and the second cover layer 42. In this case, from the viewpoint of the withstand voltage, the heating unit of the same performance can be obtained with a simpler structure. However, since a part of the second cover layer 42 is in direct contact with the back surface 1*b* of the AlN substrate 1, the glass component and the component of the AlN substrate 1 are reacted during the sintering process of the second cover layer 42 thereby incurring the foaming, which is a drawback in comparison with the above embodiments.

The heating unit and the manufacturing method thereof according to the present invention are not limited to the foregoing embodiments. For example, in the manufacturing process of the heating unit A, the step of forming the first cover layer 41 and the step of forming the third cover layer 43 may be exchanged. Also, the shape of the first cover layer 41, the second cover layer 42 and the third cover layer 43 may be designed as desired.

The invention claimed is:

1. A heating unit comprising:

an AlN substrate including a main surface;

an elongated heat-generating resistor provided on the main surface of the AlN substrate; and a protection layer for the heat-generating resistor;

wherein the protection layer includes a first cover layer covering the heat-generating resistor, a second cover layer covering the first cover layer, and a third cover layer that covers at least part of an exposed region of the main surface where the first cover layer is not provided, wherein the first cover layer is made of crystallized or semi-crystallized glass having a higher crystallization temperature by at least 50° C. than the glass softening point of the crystallized or semi-crystallized glass, the second cover layer being made of non-crystalline glass, wherein the third cover layer is made of non-crystalline glass higher in glass softening point than the non-crystalline glass constituting the second cover layer, and wherein the second cover layer is provided on the first cover layer and at least part of the third cover layer.

2. A method of making a heating unit, the method comprising the steps of:

forming, by sintering, an elongated heat-generating resistor on an AlN substrate;

forming, by sintering ,a first cover layer to cover the heat-generating resistor;

forming, by sintering, a third cover layer on the AlN substrate; and forming, by sintering, a second cover layer to cover the first cover layer and at least part of the third cover layer;

wherein the first cover layer is made of crystallized or semi-crystallized glass having a higher crystallization temperature by at least 50° C. than the glass softening point of the crystallized or semi-crystallized glass, the sintering of the first cover layer being performed at a higher crystallization temperature by 50 to 70° C. than the glass softening point of the crystallized or semi-crystallized glass, wherein the second cover layer is made of non-crystalline glass, the sintering of the second cover layer being performed at a temperature higher by at most 100° C. than the glass softening point of the non-crystalline glass.

3. The method according to claim 2, wherein the glass softening point of the crystallized or semi-crystallized glass constituting the first cover layer is no lower than 740° C., the sintering temperature of the first cover layer being in a range of 800 to 850° C.

4. The method according to claim 2, wherein the glass softening point of the non-crystalline glass constituting the second cover layer is no lower than 700° C., the sintering temperature of the second cover layer being in a range of 800 to 850° C.

5. The method according to claim 2, wherein the third cover layer is made of a non-crystalline glass higher in glass softening point than the non-crystalline glass constituting the second cover layer, and wherein the sintering of the third cover layer is performed at a temperature higher by at most 30° C. than the glass softening point of the non-crystalline glass constituting the third cover layer.

* * * * *